United States Patent
Gupta et al.

(10) Patent No.: US 7,227,798 B2
(45) Date of Patent: Jun. 5, 2007

(54) LATCH-TYPE SENSE AMPLIFIER

(75) Inventors: Anuj Gupta, Delhi (IN); Sanjeev Chopra, Punjab (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 59 days.

(21) Appl. No.: 10/679,941

(22) Filed: Oct. 6, 2003

(65) Prior Publication Data

US 2004/0136253 A1    Jul. 15, 2004

(30) Foreign Application Priority Data

Oct. 7, 2002    (IN)    .......................... 1021/Del/2002

(51) Int. Cl.
  *G11C 7/00*    (2006.01)
(52) U.S. Cl. ....................... 365/205; 365/207; 365/194
(58) Field of Classification Search ................ 365/194, 365/202, 207, 205
  See application file for complete search history.

(56) References Cited

U.S. PATENT DOCUMENTS

| | | | | |
|---|---|---|---|---|
| 4,910,713 A | | 3/1990 | Madden et al. ........ 365/189.11 |
| 5,506,524 A | * | 4/1996 | Lin .............................. 327/57 |
| 5,619,466 A | * | 4/1997 | McClure ..................... 365/207 |
| 5,883,846 A | * | 3/1999 | Lee ............................. 365/207 |
| 5,936,905 A | * | 8/1999 | Proebsting .................. 365/208 |
| 6,181,621 B1 | | 1/2001 | Lovett ......................... 365/205 |
| 6,301,180 B1 | * | 10/2001 | Sudo et al. ................. 365/207 |
| 6,351,155 B1 | * | 2/2002 | Pogrebnoy ................... 327/51 |
| 6,411,557 B2 | * | 6/2002 | Terzioglu et al. ........... 365/200 |
| 6,747,485 B1 | * | 6/2004 | Suryanarayana et al. ..... 327/51 |

* cited by examiner

*Primary Examiner*—Thong Q. Le
(74) *Attorney, Agent, or Firm*—Lisa K. Jorgenson; E. Russell Tarleton; Seed IP Law Group PLLC

(57) ABSTRACT

An improved latch-type sense amplifier circuit having two cross-coupled inverters forming a latch, a supply coupling device for selectively connecting the latch to a supply source, and a bit line coupling circuits for selectively connecting the inputs of each inverter to the complimentary bit line from the memory array. The circuit is configured to sense a voltage difference between the bit lines with improved reliability by providing a delayed sense amplifier enable signal to pass transistors for delaying disconnection of the bit lines from the sense amplifier until the latching action is completed, and adding two transistors in series with the existing transistors of the conventional latch for correcting the offset between the threshold voltages of the inverters of the latch.

25 Claims, 5 Drawing Sheets

LATCH-TYPE SENSE AMPLIFIER

BACKGROUND OF THE INVENTION

1. Field of the Invention

The present invention relates in general to latch-type sense amplifiers and, more particularly, provides an improved apparatus for a latch-type sense amplifier for sensing low voltage splits with very high reliability.

2. Description of the Related Art

Sense amplifiers are used in memory devices for sensing the output voltage of selected memory cells. With advancements in technology, memory cells are continually shrinking in size. The reduction in memory cell size is accompanied by reduction in the sensed voltage from the memory cell. Conventional sense amplifiers are unable to provide reliable operation under these conditions.

Consider the conventional latch-type sense amplifier of FIG. 1. PMOS transistor 10, PMOS transistor 20, NMOS transistor 30, and NMOS transistor 40 together form the memory latch. Bit line BL is connected through PMOS transistor 50 to the latch while complementary bit line BLB is connected through PMOS transistor 60. A latch enable transistor 70 is connected to the control signal SAEN. The PMOS pass transistors 50 and 60 are cut-off as soon as the latch enable transistor is turned on. The problem with this arrangement is that the split required for latching correct data with sufficiently high reliability is dependent on two important criteria—the threshold voltage mismatch between the NMOS sense transistors 30 and 40 in the latch, and the capacitance imbalance that may exist between the internal nodes (SN1 & SN2) of the sense amplifier. Since the sources of NMOS transistors 30 and 40 are connected together, the transistors go into saturation when an enable signal is provided. The current through them is therefore proportional to their respective $V_{gs}$–$V_{th}$ values. Since the source of the two transistors is charged to the same potential therefore, the minimum bit line split required for latching correct data is required to be greater than the threshold voltage mismatch between them. In other words, the minimum voltage differential between the inputs necessary for the correct latching of data is largely determined by the threshold voltage mismatch present between the NMOS transistors 30 and 40 forming the latch. Triggering the sense amplifier at a voltage differential equal to the minimum required voltage results in large access times, which limits the speed of the device. High-speed memory designs are not feasible with such an arrangement. This implies that a greater voltage split on the bit lines is required to offset such effects. As the discharge rate is slow in high-density memories, even a few extra milli-volts of split result in an increase in the overall access time.

U.S. Pat. No. 4,910,713 describes a general-purpose sense amplifier suited for memory and level shifting applications. In this conventional circuit arrangement, the amount of voltage split necessary for the correct data to be latched is largely governed by the threshold voltage mismatch present in the NMOS transistors forming the latch. Triggering the sense amplifier at such a voltage split results in larger access times, which ultimately proves to be a bottleneck in high-speed memory designs. A further disadvantage is that this type of sense amplifier is not very reliable when the voltage difference between the bit lines is small.

U.S. Pat. No. 6,181,621 describes a threshold voltage mismatch compensated sense amplifier for SRAM arrays. The disadvantage of the circuit described by this invention is that it is complex, involving more number of transistors, which require more signals to operate. Coordination of the many signals used in this device is cumbersome.

BRIEF SUMMARY OF THE INVENTION

The disclosed embodiments of the present invention overcome the drawbacks mentioned above and provide an improved sense amplifier that offers reliable sensing of low voltage differences thereby enabling high-speed memory cell operation and reducing the memory access times during a read operation.

An improved latch-type sense amplifier circuit is provided that avoids glitches on the nodes of the sense amplifier. The modifications include delaying the disconnection of the pass transistors connecting the bit lines to the sense amplifier and providing additional transistors to reduce the effect of threshold mismatch between the NMOS transistors of two inverters forming the latch.

In accordance with one embodiment of the invention, a sense amplifier for a memory array is provided that increases reliability in sensing small voltage differences to include cross-coupled inverters forming a latch; a supply coupling circuit for selectively connecting the latching to a supply source; a bit line coupling circuit for selectively connecting inputs of each inverter to complementary bit lines from the memory array; and a delay circuit for delaying the disconnection of the complementary bit lines from the sense amplifier.

In accordance with another aspect of the foregoing embodiment, a compensating circuit is provided that corrects for a voltage offset between the inverters of the latch and the supply coupling circuit. Ideally, the compensating circuit is formed from a pair of transistors connected between transistors of the latch and a common supply terminal.

In accordance with another embodiment of the invention, a method for improving a latch-type sense amplifier for a memory array to increase the reliability in sensing small voltage differences is provided that includes cross-coupling two inverters to form a latch; selectively coupling the latch to a supply source; selectively coupling the inputs of each inverter to complementary bit lines from the memory array; and delaying the disconnection of the bit lines from the sense amplifier until a predetermined duration after enabling of the sense amplifier latch circuit.

In accordance with another aspect of the foregoing method, the method includes correcting a voltage offset mismatch between the inverters of the latch and a supply coupling circuit. Ideally, the offset correction is performed by providing a degenerative feedback in the supply terminal path of the latch transistors that operate in a saturation mode.

In accordance with another embodiment of the invention, the latch is selectively coupled to a supply source in response to a sense amplifier enable signal, and the disconnection is delayed in response to a delayed version of the sense amplifier enable signal.

In accordance with yet another embodiment of the present invention, an amplifier for a memory array is provided that includes a latch circuit; a switch circuit for selectively coupling the latch circuit to complementary bit lines from the memory array; and a delay circuit for delaying a disconnection of the complementary bit lines from the latch circuit.

BRIEF DESCRIPTION OF THE SEVERAL VIEWS OF THE DRAWINGS

The features and advantages of the disclosed embodiments of the invention will become more apparent in reference to the following description and accompanying drawings, wherein.

DETAILED DESCRIPTION OF THE INVENTION

The disclosed embodiments of the present invention aim to overcome the above-mentioned problem of longer access times in memories by triggering the sense amplifier at a voltage split less than what is required in the conventional scheme. The improved circuit is able to achieve a substantial improvement of around 15–20% in reliability for sensing low voltages as compared to the conventional circuits. This improved reliability further results in achieving a significant access time improvement.

Figure 1:
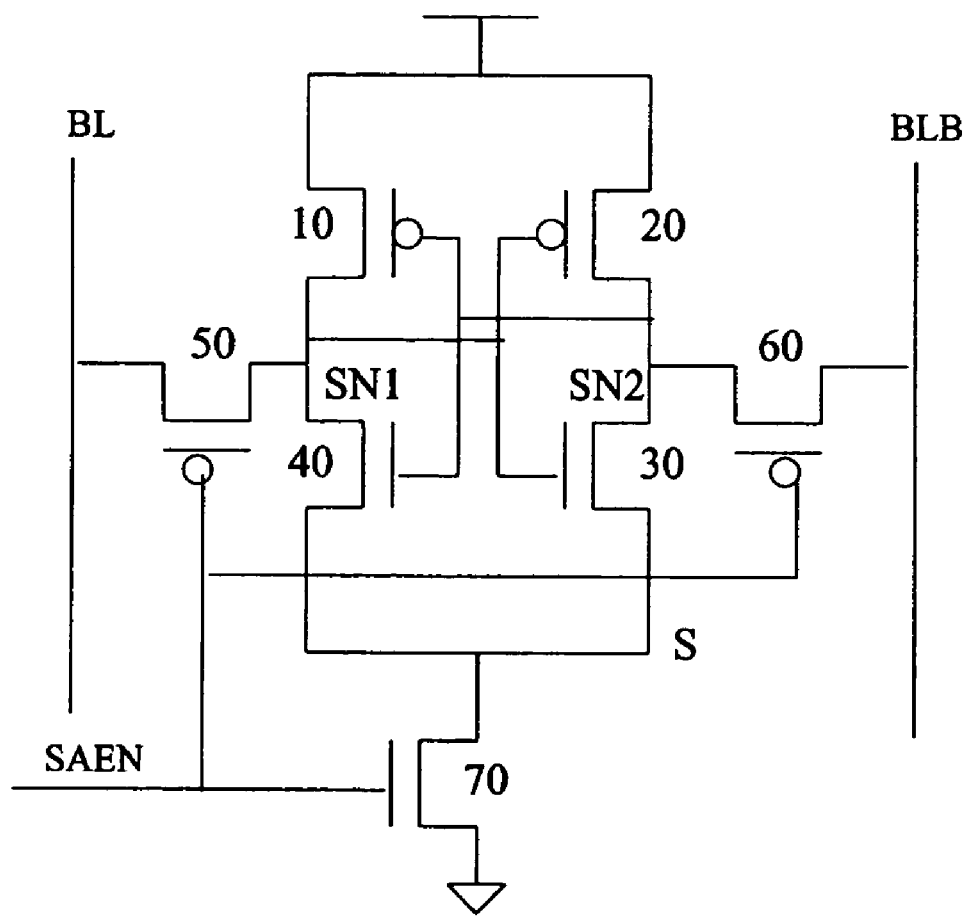
FIG. 1 illustrates the circuit diagram of a conventional latch-type sense amplifier.
Figure 2:
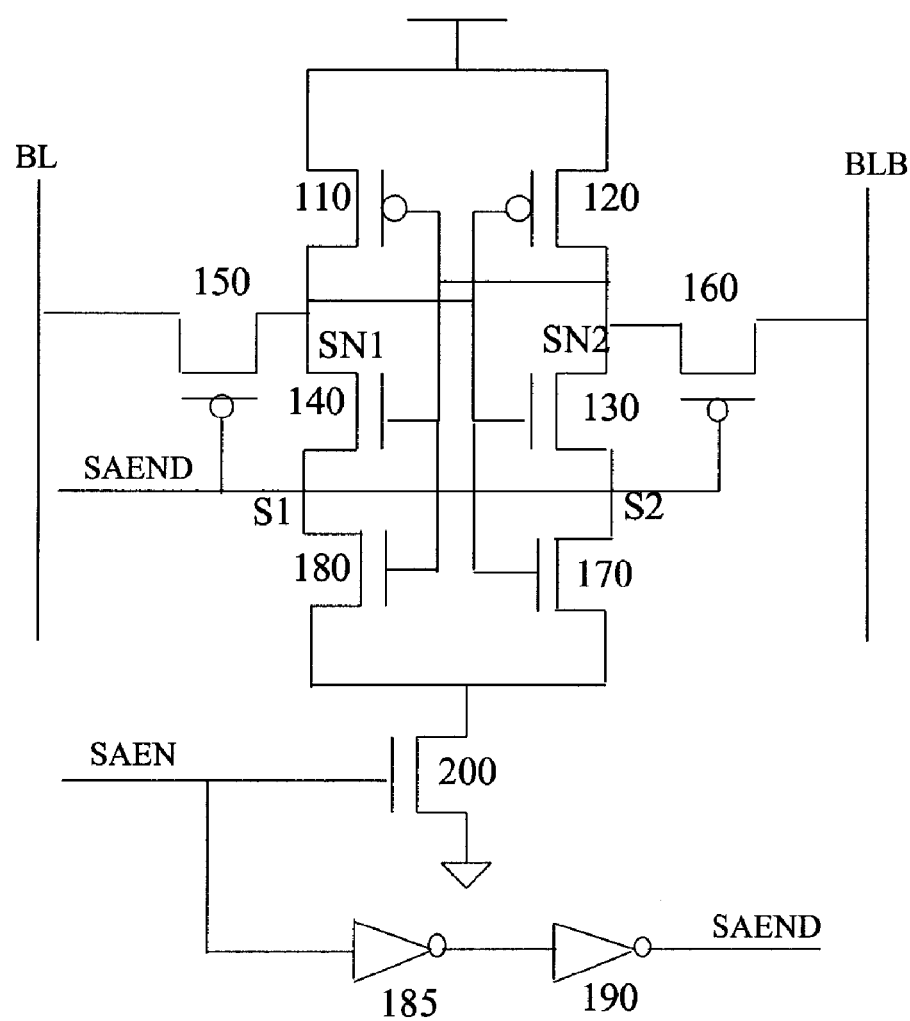
FIG. 2 shows the circuit diagram of an improved latch-type sense amplifier as provided by the present invention.

The circuit in FIG. 2 illustrates an improved latch-type sense amplifier as provided by the present invention. The circuit comprises a modified latch consisting of PMOS transistors 110, 120, NMOS transistors 130, 140, and an additional set of NMOS transistors 170, 180. The bit line BL is connected through a PMOS transistor 150 and the bit line BLB is connected through a PMOS transistor 160. The NMOS transistor 200, controlled by the SAEN signal, is used for coupling the latch to a supply enabling the latch. A delayed version of the SAEN signal, i.e., SAEND, is used to control switching off the PMOS pass transistors 150, 160. The signal SAEND is generated in the present implementation from a pair of inverters 185, 190, though it may also be generated by various other means that can delay the signal as known in the art.

The basic latch of the sense amplifier is modified to provide a mechanism that reduces the effect of threshold mismatch of the NMOS transistors 130 and 140 of inverters forming latch. This mechanism comprises two additional NMOS transistors 170 and 180 that are added in series with NMOS transistors 130 and 140 at nodes S1 and S2 present in the latch portion of a conventional sense amplifier. Considering the situation prior to receipt of the SAEN signal, the sources of NMOS transistors 130, 140 are charged to different potentials depending upon their respective threshold voltages. For the worst-case mismatch, when the node SN2 discharges, the threshold voltage of transistor 130 may be more than the threshold voltage of transistor 140. After the signal SAEN goes high, the transistors 130 and 140 operate in their saturation region while transistors 170 and 180 operate in their linear region. The drain-to-source resistance of transistor 180 is a function of the node voltage SN2 while the drain-to-source resistance of transistor 170 is a function of the node voltage SN1. The situation is such that the drain-to-source resistance of transistor 180 increases with respect to drain-to-source resistance of transistor 170, when SN2 discharges, thus effectively reducing the current through the non-discharging node in comparison to the current through the discharging node, even in the presence of a mismatch in the NMOS transistors 130 and 140. This degenerative feedback of the additional NMOS transistors 170 and 180 operating in their linear region as voltage controlled resistors reduces the effect of threshold mismatch of transistors 130 and 140 of the latch.

The second modification uses a delayed version of the Sense Amplifier Enable (SAEN) signal to keep the bit lines connected to the sense amplifier for a small duration after it has been enabled. This delay enables the regenerative feedback of the cross-coupled inverters to amplify the signal from the bit lines and aid the latch operation. The effective bit line split is reinforced by the latching action. By the time PMOS pass transistors 150 and 160 are shut off, the voltage split is sufficient for correct data to be latched.

Figure 3:
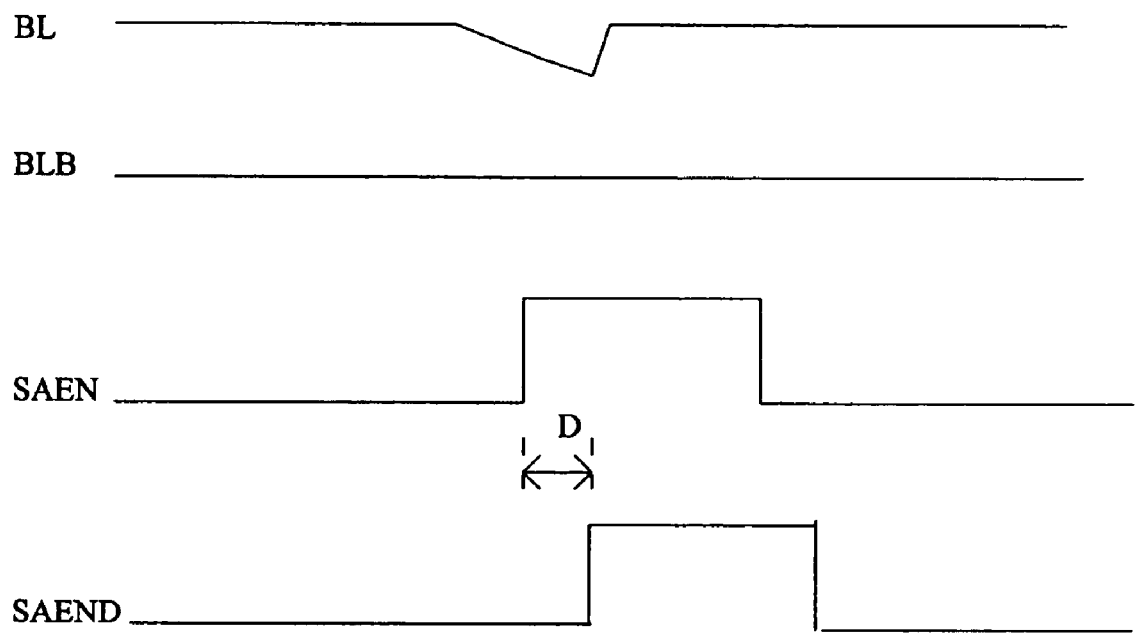
FIG. 3 shows a timing diagram illustrating the operation of an improved latch-type sense amplifier as provided by the present invention.

As shown in FIG. 3, this modification also overcomes the effects of capacitive mismatch between the SN1 and SN2 nodes of two inverters as the much larger bit line capacitance swamps out the small capacitive difference as the internal nodes of the sense amplifier are effectively joined to the bit lines during the delay duration "D".

Figure 4:
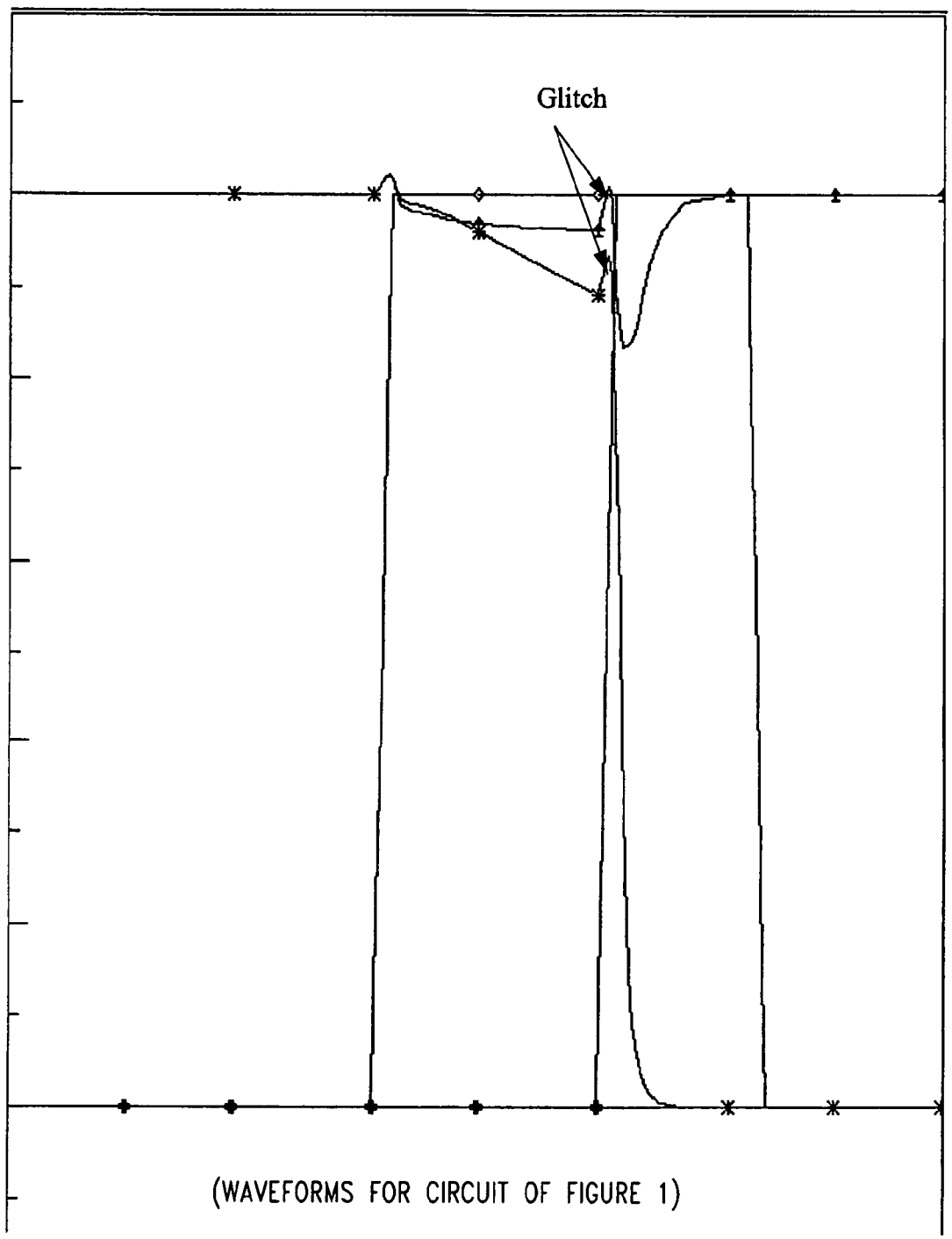
FIG. 4 shows a graph illustrating the wave forms as produced during the operation of a conventional latch-type sense amplifier.

The delay also solves the problem of a glitch occurring on the sense amplifier internal nodes in the conventional circuit due to clock-feed through as shown in FIG. 4. The glitch occurs on both the internal nodes and in the same direction but it may pose problem by reducing the effective split if the glitch on the discharging node is greater than the one on the non-discharging node.

Figure 5:
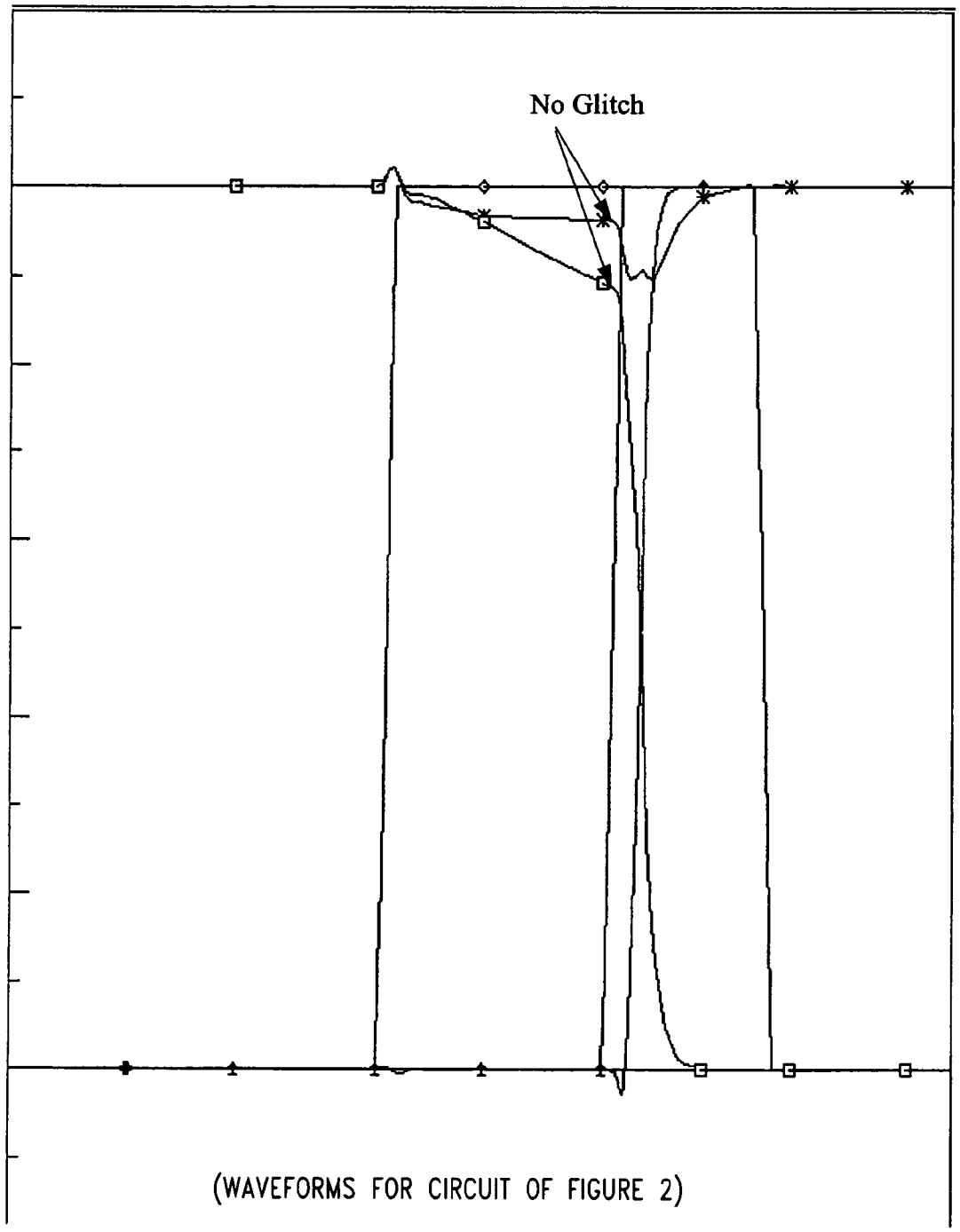
FIG. 5 shows a graph illustrating the wave forms as produced during the operation of an improved latch-type sense amplifier as provided by the present invention.

As shown in FIG. 5, the present invention avoids any glitch since the delay causes the latch to be enabled first and the PMOS pass transistors to be shut-off after some time.

The two improvements described above: a) providing a mechanism for compensating the threshold voltage of the inverters and b) providing a delayed version of the SAEN signal—can be applied independently or collectively to the design of the improved sense amplifier. The combination of both the improvements provides the best results.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The description of the present invention has been presented for purposes of illustration and is not intended to be exhaustive or limited to the invention in the form disclosed. Many modifications and variations will be apparent to those of ordinary skill in the art.

We claim:

1. A sense amplifier for a memory array providing increased reliability in sensing small voltage differences, comprising:

two cross coupled inverters forming a latch;

supply coupling means for selectively connecting the latch to a supply source;

compensating means for altering a resistance in the sense amplifier to correct an offset voltage between the inverters of the latch;

bit line coupling means for selectively connecting inputs of each inverter to complimentary bit lines from the memory array; and delaying means comprising a pair of inverters coupled to a sense amplifier enable signal source for delaying the disconnection of the bit lines from the sense amplifier after the latch has been coupled to a supply source.

2. The sense amplifier of claim 1 wherein the supply coupling means comprise an NMOS transistor.

3. The sense amplifier of claim 1 wherein the bit line coupling means comprise a PMOS transistor connected in series between each complimentary bit line and the latch.

4. The sense amplifier of claim 1 wherein the compensating means comprise a pair of NMOS transistors connected between the latch and the supply source.

5. The sense amplifier of claim 1 wherein the supply coupling means is controlled by an enable signal.

6. An The sense amplifier of claim 5 wherein the delay is introduced between enabling of the supply coupling means and the bit line coupling means.

7. The sense amplifier of claim 1 wherein the delaying means comprises a plurality of inverters connected in series.

8. A method for improving a latch-type sense amplifier for a memory array in order to increase reliability in sensing small voltage differences, comprising the steps of:
cross coupling two inverters to form a latch;
selectively coupling the latch to a supply source;
selectively coupling the inputs of each inverter to complimentary bit lines from the memory array;
delaying the disconnection of the bit lines from the sense amplifier until a predetermined duration after coupling the latch with the supply source in response to a sense amplifier enable signal; and
altering a resistance in the amplifier to correct an offset mismatch between the inverters of the latch.

9. The method for improving a latch-type sense amplifier of claim 8 wherein the offset correction is performed by providing degenerative feedback in the supply terminal path of the latch transistors that operate in the saturation mode.

10. The method for improving a latch-type sense amplifier of claim 8 wherein the disconnection of the bit lines is delayed from the connection of the supply coupling means by utilizing a delayed version of a sense amplifier enable signal to disconnect the bit lines.

11. An amplifier for a memory array, comprising:
a latch circuit;
a switch circuit configured to selectively connect inputs of the latch circuit to complementary bit lines from the memory array;
a delay circuit coupled to the switch circuit and configured to receive a sense amplifier enable signal and delay a disconnection of the bit lines from the latch circuit and coupling the supply coupling means to the latch by delaying the sense amplifier enable signal; and
a compensation circuit coupled to the latch and configured to alter a resistance in the amplifier to correct for an offset between the inverters of the latch and a supply coupling circuit that selectively connects the latch to a voltage supply source.

12. The amplifier of claim 11 wherein the latch comprises first and second inverters cross-coupled together.

13. The amplifier of claim 12 wherein the inverters are formed of CMOS transistors.

14. The amplifier of claim 11 wherein the delay circuit is configured to generate a delayed enable signal in response to a sense amplifier enable signal.

15. An amplifier circuit for a memory array, comprising:
a first PMOS transistor having a first terminal coupled to a voltage source, a second terminal coupled to a first node, and a control gate coupled to a second node;
a second PMOS transistor having a first terminal coupled to the voltage supply source, a second terminal coupled to the second node, and a control gate coupled to the first node;
a first NMOS transistor having a first terminal coupled to the first node, a control gate coupled to the second node, and a second terminal coupled to a third node;
a second NMOS transistor having a first terminal coupled to the second node, a control gate coupled to the first node, and a second terminal coupled to a fourth node;
a third NMOS transistor having a first terminal coupled to the third node, a control gate coupled to the second node, and a second terminal;
a fourth NMOS transistor having a first terminal coupled to the fourth node, a control gate coupled to the first node, and a second terminal coupled to the second terminal of the third NMOS transistor;
a fifth NMOS transistor having a first terminal coupled to the second terminals of the third and fourth NMOS transistors, a second terminal coupled to a voltage reference, and a control gate coupled to a sense amplifier enable signal source;
a third PMOS transistor having a first terminal coupled to the first node, a second terminal configured to be coupled to a first bit line of the memory array, and a control gate coupled to a delayed sense amplifier enable signal source;
a fourth PMOS transistor having a first terminal configured to be coupled to a second bit line of the memory array, a second terminal coupled to the second node, and a control gate coupled to a delayed sense amplifier enable signal source; and
wherein the third and fourth NMOS transistors form a compensating circuit configured to correct a voltage offset between the first and second inverter circuits of the latch and the fifth NMOS transistor.

16. The amplifier of claim 15 wherein the delayed sense amplifier enable signal source comprises an input coupled to the sense amplifier enable signal source and an output, and further comprising first and second series-coupled inverters, the first inverter having an input coupled to the input of the delayed sense amplifier enable signal source and an output coupled to the input of the second inverter that has an output coupled to the output of the delayed sense amplifier enable signal source.

17. The amplifier of claim 15 wherein the first PMOS transistor and first NMOS transistor form a first inverter circuit, the second PMOS transistor and second NMOS transistor form a second inverter circuit, the first and second inverter circuits comprising a latch.

18. A method for sensing voltage differences in a memory array, comprising the steps of:
enabling a latch circuit;
selectively coupling inputs of the latch circuit to complementary bit lines of the memory array;
receiving and delaying a sense amplifier enable signal by a delay time, and disconnecting the latch circuit from the complementary bit lines after the delay time following the step of enabling of the latch circuit; and
altering a resistance in the latch circuit to correct a voltage offset mismatch between inverters of the latch circuit and a circuit for enabling the latch circuit.

19. The method of claim 18 wherein enabling the latch circuit comprises selectively coupling the latch circuit to a supply source.

20. The method of claim 19, further comprising the step of generating a delayed disconnect signal that initiates disconnection of the latch circuit from the complementary bit lines after the supply coupling means has been connected to the latch.

21. The sense amplifier of claim 15, further comprising compensating means for correcting an offset between inverters of the latch circuit that comprises the first and second PMOS transistors and the first and second NMOS transistors.

22. The method of claim 18 wherein the step of correcting the voltage offset mismatch comprises providing degenerative feedback in a supply terminal path of the inverter transistors that operate in a saturation mode.

23. An amplifier circuit for a memory array, comprising:
a first PMOS transistor having a first terminal coupled to a voltage source, a second terminal coupled to a first node, and a control gate coupled to a second node;
a second PMOS transistor having a first terminal coupled to the voltage supply source, a second terminal coupled to the second node, and a control gate coupled to the first node;
a first NMOS transistor having a first terminal coupled to the first node, a control gate coupled to the second node, and a second terminal coupled to a third node;
a second NMOS transistor having a first terminal coupled to the second node, a control gate coupled to the first node, and a second terminal coupled to a fourth node;
a third NMOS transistor having a first terminal coupled to the third node, a control gate coupled to the second node, and a second terminal;
a fourth NMOS transistor having a first terminal coupled to the fourth node, a control gate coupled to the first node, and a second terminal coupled to the second terminal of the third NMOS transistor;
a fifth NMOS transistor having a first terminal coupled to the second terminals of the third and fourth NMOS transistors, a second terminal coupled to a voltage reference, and a control gate coupled to a sense amplifier enable signal source;
a third PMOS transistor having a first terminal coupled to the first node, a second terminal configured to be coupled to a first bit line of the memory array, and a control gate coupled to a delayed sense amplifier enable signal source;
a fourth PMOS transistor having a first terminal configured to be coupled to a second bit line of the memory array, a second terminal coupled to the second node, and a control gate coupled to a delayed sense amplifier enable signal source; and
wherein the delayed sense amplifier enable signal source comprises an input coupled to the sense amplifier enable signal source and an output, and further comprising first and second series-coupled inverters, the first inverter having an input coupled to the input of the delayed sense amplifier enable signal source and an output coupled to an input of the second inverter that has an output coupled to the output of the delayed sense amplifier enable signal source.

24. The amplifier circuit of claim 23, further comprising compensating means for correcting an offset between the first and second series-coupled inverters.

25. The amplifier circuit of claim 24 wherein the compensating means comprises a pair of NMOS transistors coupled between the first and second series-coupled inverters and the voltage source.

* * * * *